United States Patent
Inoue et al.

(10) Patent No.: US 12,211,726 B2
(45) Date of Patent: Jan. 28, 2025

(54) MEMBER FOR SEMICONDUCTOR MANUFACTURING APPARATUS

(71) Applicant: NGK Insulators, Ltd., Nagoya (JP)

(72) Inventors: Seiya Inoue, Handa (JP); Tatsuya Kuno, Nagoya (JP); Natsuki Hirata, Nagoya (JP); Kenji Yonemoto, Tokoname (JP)

(73) Assignee: NGK INSULATORS, LTD., Nagoya (JP)

( * ) Notice: Subject to any disclaimer, the term of this patent is extended or adjusted under 35 U.S.C. 154(b) by 162 days.

(21) Appl. No.: 18/170,129

(22) Filed: Feb. 16, 2023

(65) Prior Publication Data

US 2024/0038567 A1    Feb. 1, 2024

Related U.S. Application Data

(63) Continuation of application No. PCT/JP2022/028748, filed on Jul. 26, 2022.

(51) Int. Cl.
*H01L 21/683* (2006.01)
*H01J 37/32* (2006.01)

(52) U.S. Cl.
CPC .... *H01L 21/6833* (2013.01); *H01J 37/32724* (2013.01)

(58) Field of Classification Search
CPC .............. H01L 21/6833; H01J 37/32724
See application file for complete search history.

(56) References Cited

U.S. PATENT DOCUMENTS 6,481,886 B1 *  11/2002  Narendrnath ..... H01L 21/67248
                                                              374/161
7,651,269 B2 *   1/2010  Comendant .............. G01K 1/16
                                                              374/161

(Continued)

FOREIGN PATENT DOCUMENTS

JP       S57-039924 A     3/1982
JP         3154629 U    10/2009

(Continued)

OTHER PUBLICATIONS

International Search Report and Written Opinion (Application No. PCT/JP2022/028748) dated Oct. 4, 2022.

(Continued)

*Primary Examiner* — Scott Bauer
(74) *Attorney, Agent, or Firm* — BURR PATENT LAW, PLLC (57) ABSTRACT

A member for a semiconductor manufacturing apparatus, includes: a ceramic plate that has a ceramic plate through hole; an electroconductive base plate that has a base plate through hole and that is disposed on a lower surface side of the ceramic plate; an insulating sleeve which is inserted into the base plate through hole and of which an outer peripheral surface is adhered to an inner peripheral surface of the base plate through hole via an adhesion layer; and a sleeve through hole that passes through the insulating sleeve in the up-down direction and that communicates with the ceramic plate through hole. The insulating sleeve has a tool engaging portion that is engageable with an external tool, and upon being engaged with the external tool, the tool engaging portion transmits rotation torque of the external tool to the insulating sleeve.

6 Claims, 8 Drawing Sheets

(56) References Cited

U.S. PATENT DOCUMENTS

| | | | | |
|---|---|---|---|---|
| 8,636,873 | B2* | 1/2014 | Higuma | C23C 16/4581 |
| | | | | 118/728 |
| 2007/0243057 | A1* | 10/2007 | Shimada | H01L 21/68785 |
| | | | | 414/792.8 |
| 2009/0173449 | A1* | 7/2009 | Nakamura | H01L 21/6831 |
| | | | | 156/379.6 |
| 2009/0245971 | A1* | 10/2009 | Iizuka | F16B 35/041 |
| | | | | 219/121.4 |
| 2014/0346152 | A1 | 11/2014 | Sasaki et al. | |
| 2014/0376148 | A1 | 12/2014 | Sasaki et al. | |
| 2019/0019714 | A1* | 1/2019 | Kosakai | H02N 13/00 |
| 2019/0131163 | A1 | 5/2019 | Kuno et al. | |
| 2020/0090959 | A1* | 3/2020 | Takebayashi | H05B 3/74 |
| 2020/0343125 | A1 | 10/2020 | Kinpara et al. | |
| 2021/0327741 | A1 | 10/2021 | Nagayama et al. | |

FOREIGN PATENT DOCUMENTS

| | | |
|---|---|---|
| JP | 2013-191626 A | 9/2013 |
| TW | 201340245 A | 10/2013 |
| TW | 201344838 A | 11/2013 |
| TW | 202025368 A | 7/2020 |
| WO | 2018/216797 A1 | 11/2018 |
| WO | 2019/131115 A1 | 7/2019 |

OTHER PUBLICATIONS

Taiwanese Office Action (Application No. 112106020) dated Sep. 20, 2023 (3 pages).

* cited by examiner

MEMBER FOR SEMICONDUCTOR MANUFACTURING APPARATUS

BACKGROUND OF THE INVENTION

1. Field of the Invention

The present invention relates to a member for a semiconductor manufacturing apparatus.

2. Description of the Related Art

A member for a semiconductor manufacturing apparatus which includes a ceramic plate with electrodes embedded therein and an electroconductive base plate provided on a lower surface side of the ceramic plate has been known. For example, PTL 1 discloses a member for a semiconductor manufacturing apparatus including ceramic plate through holes that pass through a ceramic plate in a thickness direction, base plate through holes that pass through a base plate in a thickness direction, and insulating sleeves which are inserted into the base plate through holes and of which an outer peripheral surface is adhered to an inner peripheral surface of the base plate through holes via adhesion layers.

CITATION LIST

Patent Literature

PTL 1: Japanese Registered Utility Model No. 3154629

SUMMARY OF THE INVENTION

When such a member for a semiconductor manufacturing apparatus is used for long periods of time, an adhesive agent between the base plate through holes and the insulating sleeves may deteriorate due to corrosion and become worn. When the adhesive agent becomes worn, the member for a semiconductor manufacturing apparatus often becomes usable again by replacing the adhesive agent. Replacement of the adhesive agent requires the insulating sleeves to be temporarily removed and to be adhered again. However, work of removing the insulating sleeves is highly difficult, and the ceramic plate or base plate may be damaged when the work is performed.

The present invention has been made to solve such a problem, and a primary object thereof is to enable easy removal of the insulating sleeves.

[1] A member for a semiconductor manufacturing apparatus according to the present invention includes a ceramic plate that has a wafer placement surface on an upper surface and that has an electrode embedded therein, a ceramic plate through hole that passes through the ceramic plate in an up-down direction, a base plate that has electroconductivity and that is disposed on a lower surface side of the ceramic plate, a base plate through hole that passes through the base plate in the up-down direction, an insulating sleeve, which is inserted into the base plate through hole and of which an outer peripheral surface is adhered to an inner peripheral surface of the base plate through hole via an adhesion layer, and a sleeve through hole that passes through the insulating sleeve in the up-down direction and that communicates with the ceramic plate through hole. The insulating sleeve has a tool engaging portion that is engageable with an external tool. Upon being engaged with the external tool, the tool engaging portion transmits rotation torque of the external tool to the insulating sleeve.

In this member for a semiconductor manufacturing apparatus, the insulating sleeve has the tool engaging portion that is engageable with the external tool. Upon being engaged with the external tool, the tool engaging portion transmits rotation torque of the external tool to the insulating sleeve. At the time of removing the insulating sleeve from the base plate through hole, the external tool is engaged with the tool engaging portion. Rotating the external tool breaks the adhesion layer by rotation torque thereof. Accordingly, the insulating sleeve can be easily removed from the base plate through hole.

[2] In the member for a semiconductor manufacturing apparatus according to the present invention (the member for a semiconductor manufacturing apparatus according to the above [1]), the base plate may have a refrigerant flow path embedded therein, and the tool engaging portion may be provided downward from a bottom surface of the refrigerant flow path. When the tool engaging portion is provided upward from the bottom surface of the refrigerant flow path, the shape of the tool engaging portion may affect heat uniformity of the wafer, but the tool engaging portion is provided downward from the bottom surface of the refrigerant flow path here, and accordingly the effects thereof are reduced.

[3] In the member for a semiconductor manufacturing apparatus according to the present invention (the member for a semiconductor manufacturing apparatus according to the above [2]), a lower end of the adhesion layer may be situated at a height that is the same as or downward from the bottom surface of the refrigerant flow path and that is upward from the tool engaging portion. When the lower end of the adhesion layer is situated at a height that is the same as or downward from the bottom surface of the refrigerant flow path, heat from the ceramic plate is efficiently transferred to the refrigerant flow path via the adhesion layer. Also, when the lower end of the adhesion layer is situated upward from the tool engaging portion, a smaller amount of the adhesion layer is needed, and the insulating sleeve is easier to be removed from the base plate through hole.

[4] In the member for a semiconductor manufacturing apparatus according to the present invention (the member for a semiconductor manufacturing apparatus according to any one of the above [1] to [3]), the tool engaging portion may be a female screw thread portion provided in the sleeve through hole, or may be a male screw thread portion provided on the outer peripheral surface of the insulating sleeve, or may be a plurality of slit grooves provided along the up-down direction from a lower end of the insulating sleeve. In a case in which the tool engaging portion is a male screw thread portion, a female screw thread can be used as the external tool. In a case in which the tool engaging portion is a female screw thread portion, a male screw thread can be used as the external tool. In a case in which the tool engaging portion is slit grooves, a tool that has insertion portions insertable into at least two of the plurality of slit grooves, for example, can be used as the external tool.

[5] In the member for a semiconductor manufacturing apparatus according to the present invention (the member for a semiconductor manufacturing apparatus according to any one of the above [1] to [3]), a cross section of the sleeve through hole, taken in the tool engaging portion along a plane that is parallel to the wafer placement surface, may be a polygon, may be a shape of a circle provided with a protruding portion or a recessed portion, or may be a shape in which a circle is cut away along two parallel chords. In a case in which the tool engaging portion is a hole that has a predetermined cross-sectional shape (a polygon, a shape of a circle provided with a protruding portion or a recessed portion, or a shape in which a circle is cut away along two parallel chords), a tool that fits into that predetermined shape, for example, can be used as the external tool.

[6] In the member for a semiconductor manufacturing apparatus according to the present invention (the member for a semiconductor manufacturing apparatus according to any one of the above [1] to [3]), an outer shape of a cross section of the insulating sleeve, taken in the tool engaging portion along a plane that is parallel to the wafer placement surface, may be a polygon, may be a shape of a circle provided with a protruding portion or a recessed portion, or may be a shape in which a circle is cut away along two parallel chords. In a case in which the tool engaging portion has an outer shape that has a predetermined cross-sectional shape (a polygon, a shape of a circle provided with a protruding portion or a recessed portion, or a shape in which a circle is cut away along two parallel chords), a tool that fits into that predetermined shape, for example, can be used as the external tool.

DETAILED DESCRIPTION OF THE INVENTION

Figure 1:
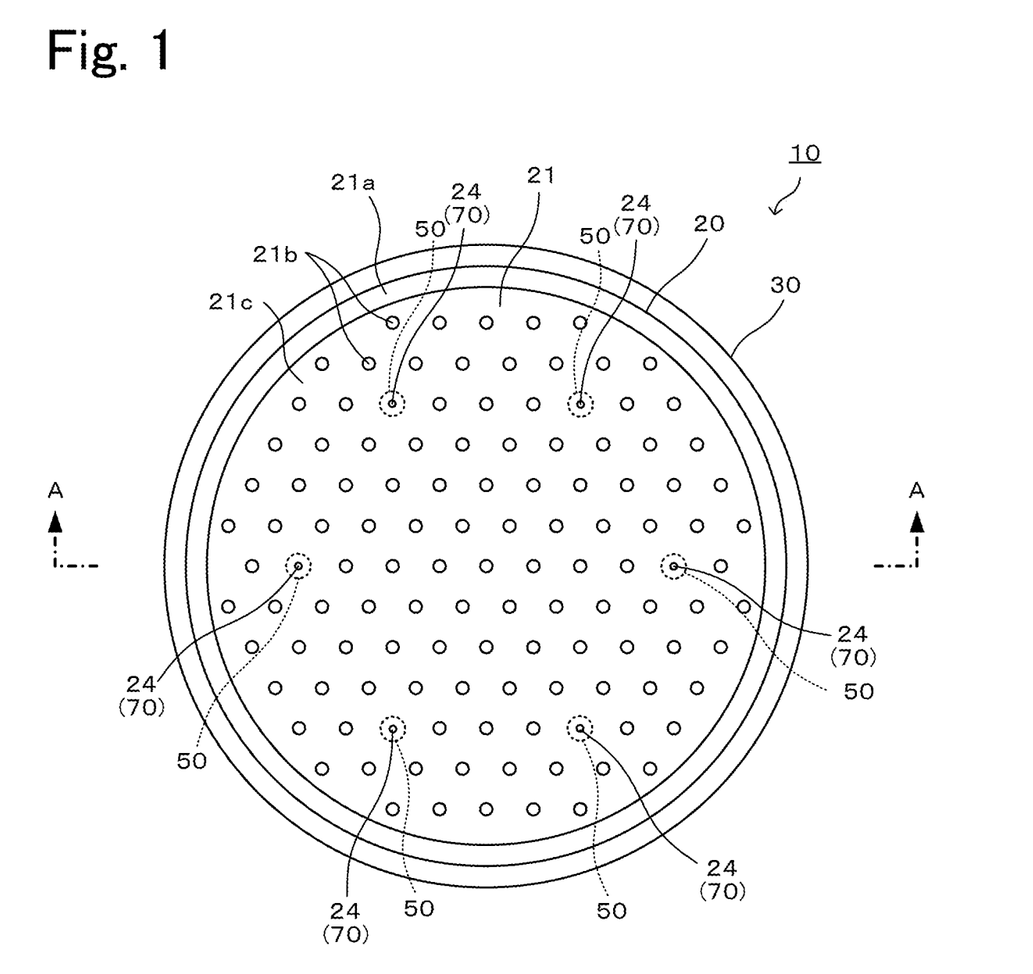
FIG. 1 is a plan view of a wafer placement table 10.
Figure 2:
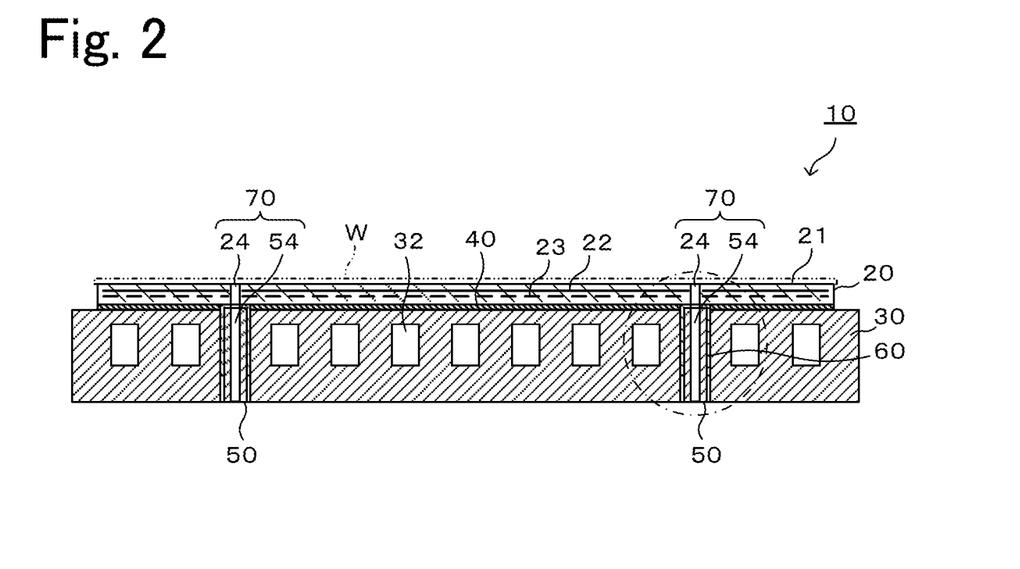
FIG. 2 is a cross-sectional view along A-A in FIG. 1.
Figure 3:
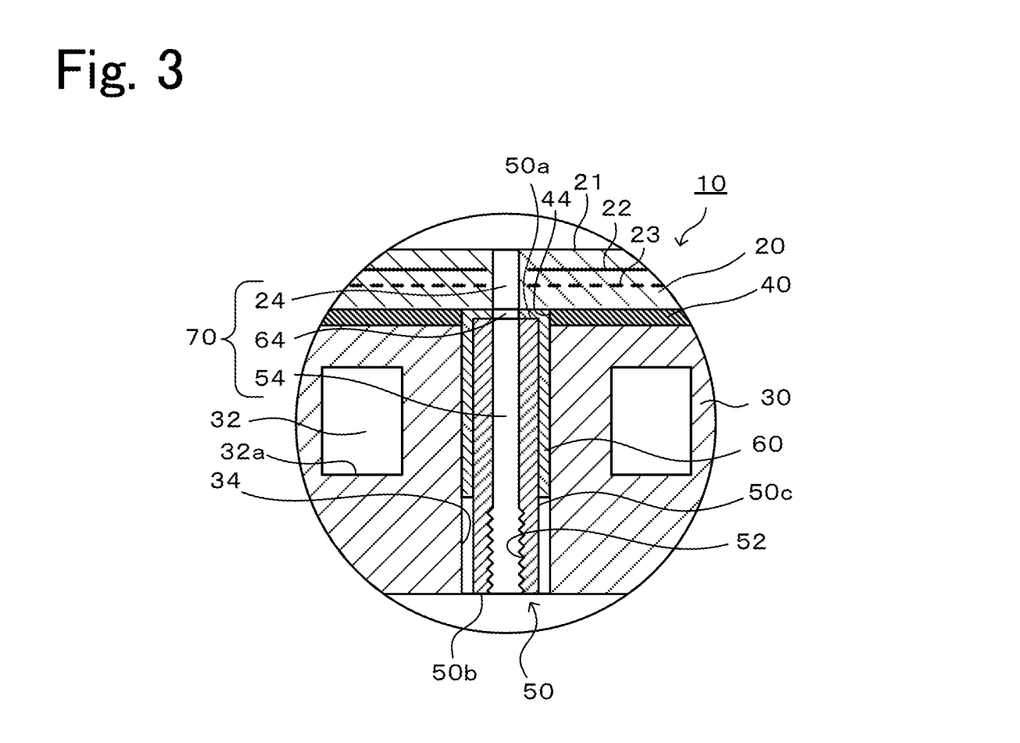
FIG. 3 is an enlarged view of part of FIG. 2.
Figure 4A:
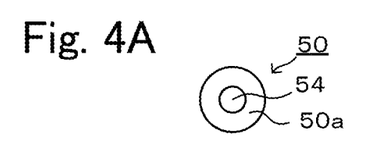
FIGS. 4A to 4C are explanatory diagrams of an insulating sleeve 50.
Figure 4B:
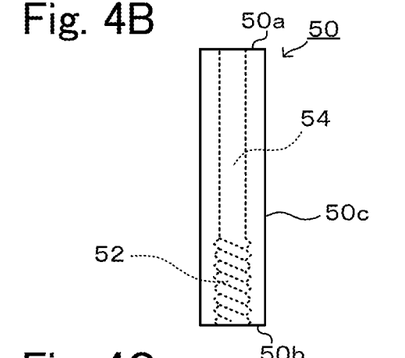
Figure 4C:
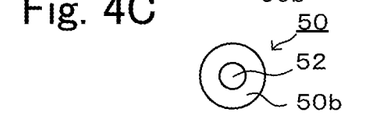

Next, preferred embodiments of the present invention will be described with reference to the drawings. FIG. 1 is a plan view of a wafer placement table 10, FIG. 2 is a cross-sectional view along A-A in FIG. 1, FIG. 3 is an enlarged view of part of FIG. 2 (an enlarged view of within a single-dot chain line frame), and FIGS. 4A to 4C are explanatory diagrams of an insulating sleeve 50 (FIG. 4A is a plan view, FIG. 4B is a front view, and FIG. 4C is a bottom view). Note that in the present specification, "up" and "down" do not represent absolute positional relations but represent relative positional relations. Accordingly, depending on the orientation of the wafer placement table 10, "up" and "down" may be "down" and "up", be "left" and "right", or be "front" and "rear".

The wafer placement table 10 is an example of a member for a semiconductor manufacturing apparatus according to the present invention and, as illustrated in FIG. 2, includes a ceramic plate 20, a base plate 30, a bonding layer 40, insulating sleeves 50, adhesion layers 60, and gas holes 70.

The ceramic plate 20 is a ceramic disc (e.g., 300 mm in diameter and 5 mm thick) of an alumina sintered body, aluminum nitride sintered body, or the like. An upper surface of the ceramic plate 20 is a wafer placement surface 21 on which a wafer W is placed. The ceramic plate 20 has an electrostatic electrode 22 and a heater electrode 23 embedded therein, in order of closeness to the wafer placement surface 21. As illustrated in FIG. 1, the wafer placement surface 21 of the ceramic plate 20 includes a seal band 21a formed in an annular shape so as to follow an outer edge of the wafer placement surface 21 and includes a plurality of small circular protrusions 21b formed on the entire surface inside the seal band 21a. The seal band 21a and the small circular protrusions 21b have the same height, this height being several μm to several 10 μm, for example. The portion of the wafer placement surface 21 where the seal band 21a and the small circular protrusions 21b are not formed will be referred to as a reference surface 21c.

The electrostatic electrode 22 is a planar mesh electrode and is connected to an external direct current power source via a power feed member that is omitted from illustration. The power feed member is electrically insulated from the bonding layer 40 and the base plate 30. When direct current voltage is applied to the electrostatic electrode 22, the wafer W is fixed by attraction to the wafer placement surface 21 (specifically, to an upper surface of the seal band 21a and upper surfaces of the small circular protrusions 21b) by electrostatic attraction force, and when the application of the direct current voltage is disengaged, the fixing by attraction of the wafer W to the wafer placement surface 21 is disengaged.

The heater electrode 23 is a resistance heating element that is laid out from one end to the other end over the entirety of the ceramic plate 20 in plan view in a one-stroke pattern. A heater power source is connected to the one end and the other end of the heater electrode 23 via power feed members that are omitted from illustration. The power feed members are electrically insulated from the bonding layer 40 and the base plate 30. When electricity is applied, the heater electrode 23 generates heat and heats the wafer placement surface 21 and thus the wafer W.

The base plate 30 is a disc (e.g., a disc that is of the same diameter as or larger in diameter than the ceramic plate 20, 20 to 40 mm thick) with good electroconductivity and thermal conductivity. A refrigerant flow path 32 is formed within the base plate 30, through which refrigerant circulates. The refrigerant flowing through the refrigerant flow path 32 preferably is a liquid and preferably is electrically insulating. Examples of the electrically insulating liquid include a fluorine-based inert liquid and so forth. The refrigerant flow path 32 is formed in a one-stroke pattern from one end (entrance) to the other end (exit) of the base plate 30 over the entirety thereof in plan view. A supply port and a recovery port of an external refrigerant device that is omitted from illustration are connected to the one end and the other end of the refrigerant flow path 32, respectively. Refrigerant that is supplied from the supply port of the external refrigerant device to the one end of the refrigerant flow path 32 passes through the refrigerant flow path 32, thereafter returns to the recovery port of the external refrigerant device from the other end of the refrigerant flow path 32, and then is supplied to the one end of the refrigerant flow path 32 again from the supply port after the temperature thereof is adjusted. The base plate 30 is connected to a radio frequency (RF) power source and is also used as an RF electrode.

Examples of the material of the base plate 30 include metal materials, composite materials of metal and ceramic, and so forth. Examples of the metal materials include Al, Ti, Mo, alloys thereof, and so forth. Examples of the composite materials of metal and ceramic include metal matrix composites (MMC), ceramic matrix composites (CMC), and so forth. Specific examples of such composite materials include materials including Si, SiC, and Ti (also referred to as SiSiCTi), a material in which a SiC porous body is impregnated with Al and/or Si, a composite material of $Al_2O_3$ and TiC, and so forth. A material that has a coefficient of thermal expansion close to that of the material of the ceramic plate 20 is preferably selected as the material of the base plate 30.

The bonding layer 40 is made of metal here and joins a lower surface of the ceramic plate 20 and an upper surface of the base plate 30. The bonding layer 40 is formed by TCB (thermal compression bonding). TCB is a known method in which a metal joining material is sandwiched between two members to be joined and heated to a temperature no higher than the solidus temperature of the metal joining material, and in which, in this state, the two members are joined by pressurization.

The insulating sleeves 50 are accommodated in base plate through holes 34. The base plate through holes 34 are holes that pass through the base plate 30 in an up-down direction and are provided so as not to pass through the refrigerant flow path 32. Upper end surfaces 50a of the insulating sleeves 50 enter into bonding layer through holes 44 that pass through the bonding layer 40 that is made of metal in the up-down direction. Lower end surfaces 50b of the insulating sleeves 50 are at substantially the same height as a lower surface of the base plate 30. The insulating sleeves 50 are substantially cylindrical members that are made of an electrically insulating material (e.g., the same material as the ceramic plate 20) and have sleeve through holes 54 that pass through the insulating sleeves 50 in the up-down direction along a center axis of the insulating sleeves 50. Outer peripheral surfaces 50c of the insulating sleeves 50 are adhered to inner peripheral surfaces of the base plate through holes 34 via the adhesion layers 60. Examples of the material of the adhesion layers 60 include insulating resins such as epoxy resin, acrylic resin, silicon resin, and so forth. The adhesion layers 60 fill in between the outer peripheral surfaces 50c of the insulating sleeves 50 and inner peripheral surfaces of the bonding layer through holes 44 as well and further also enter into a space between the upper end surfaces 50a of the insulating sleeves 50 and the lower surface of the ceramic plate 20. Lower ends of the adhesion layers 60 are situated at a height that is the same as or downward from a bottom surface 32a of the refrigerant flow path 32.

The insulating sleeves 50 have female screw thread portions 52 serving as tool engaging portions that are engageable with a reworking tool 90 to be described later. The female screw thread portions 52 are provided to a portion of the sleeve through holes 54 downward from the bottom surface 32a of the refrigerant flow path 32. Upon being engaged with the reworking tool 90, the female screw thread portions 52 transmit rotation torque of the reworking tool 90 to the insulating sleeves 50. The lower ends of the adhesion layers 60 are situated upward from the female screw thread portions 52.

Each of the gas holes 70 is made up of a ceramic plate through hole 24 and a sleeve through hole 54. The ceramic plate through holes 24 pass through the ceramic plate 20 in the up-down direction (thickness direction). The ceramic plate through holes 24 open to the reference surface 21c of the wafer placement surface 21. Neither the electrostatic electrode 22 nor the heater electrode 23 is exposed at inner peripheral surfaces of the ceramic plate through holes 24. That is to say, the inner peripheral surfaces of the ceramic plate through holes 24 are covered by ceramic. The sleeve through holes 54 communicate with the ceramic plate through holes 24. The gas holes 70 are used to supply heat-transferring gas to the wafer placement surface 21. Note that in the present embodiment, openings 64 of the adhesion layers 60 between the lower surface of the ceramic plate 20 and the upper end surfaces 50a of the insulating sleeves 50 also make up part of the gas holes 70.

Figure 5A:
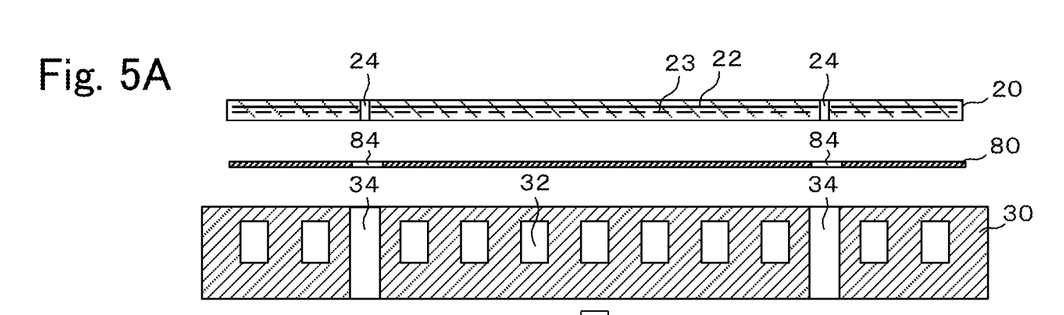
FIGS. 5A to 5C are manufacturing process diagrams of the wafer placement table 10.
Figure 5B:
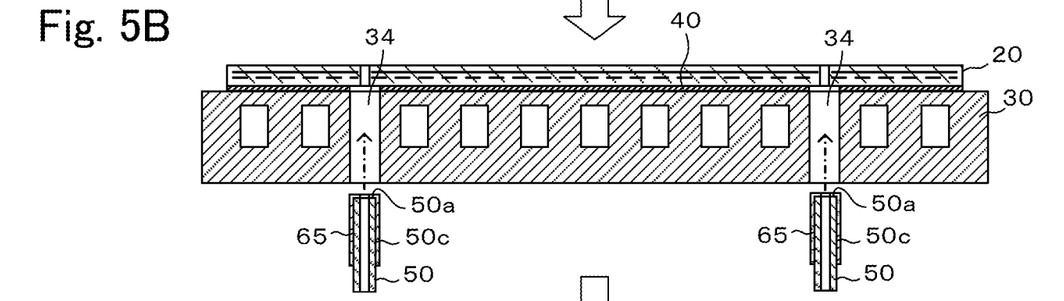
Figure 5C:
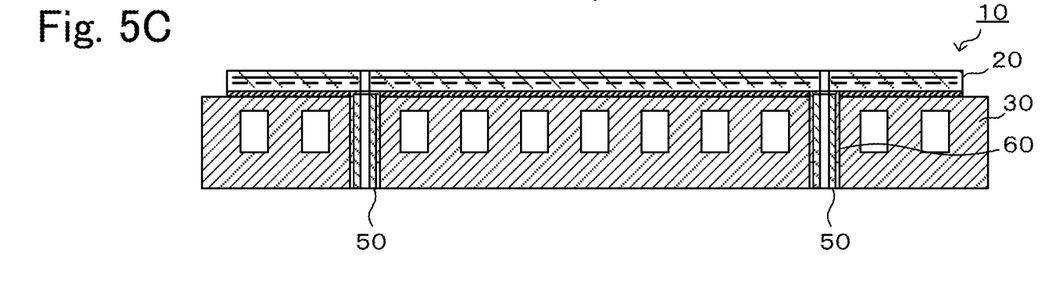

Next, an example of a manufacturing process of the wafer placement table 10 will be described with reference to FIGS. 5A to 5C. FIGS. 5A to 5C are manufacturing process diagrams of the wafer placement table 10.

First, the ceramic plate 20, the base plate 30, and a metal joining material 80 are prepared (FIG. 5A). The ceramic plate 20 has the electrostatic electrode 22 and the heater electrode 23 embedded therein and includes the ceramic plate through holes 24. The base plate 30 has the refrigerant flow path 32 embedded therein and includes the base plate through holes 34. The metal joining material 80 has joining material through holes 84 at positions facing the base plate through holes 34 of the base plate 30. The diameter of the joining material through holes 84 is the same as or slightly larger than the diameter of the base plate through holes 34. The metal joining material 80 is sandwiched between the upper surface of the base plate 30 and the lower surface of the ceramic plate 20, thereby forming a stacked body. At this time, positioning is performed such that the base plate through holes 34, the joining material through holes 84, and the ceramic plate through holes 24 are communicating.

Next, the stacked body is pressurized at a temperature no higher than the solidus temperature of the metal joining material 80 (e.g., a temperature no lower than a temperature obtained by subtracting 20° C. from the solidus temperature and no higher than the solidus temperature) so as to carry out joining (TCB) and thereafter is returned to room temperature. Thus, the ceramic plate 20 and the base plate 30 are joined by the bonding layer 40 that the metal joining material 80 has changed into (FIG. 5B). An Al—Mg-based joining material or an Al—Si—Mg-based joining material can be used as the metal joining material 80.

Next, the insulating sleeves 50 are prepared. The upper end surfaces 50a and the outer peripheral surfaces 50c of the insulating sleeves 50 are coated with an adhesive agent 65, and the insulating sleeves 50 are inserted into the base plate through holes 34 from the upper end surfaces 50a thereof (FIG. 5B). Note that while FIG. 5B illustrates the insulating sleeves 50 being inserted from below the base plate 30, the stacked body in FIG. 5B may be turned upside down, and the insulating sleeves 50 may be inserted from above the base plate 30.

Thereafter, the adhesive agent 65 cures, and becomes the adhesion layers 60, thereby yielding the wafer placement table 10 (FIG. 5C).

Next, a usage example of the wafer placement table 10 configured in this way will be described. First, in a state in which the wafer placement table 10 is set in a chamber that is omitted from illustration, the wafer W is placed on the wafer placement surface 21. Inside of the chamber is drawn to a predetermined vacuum by depressurizing by a vacuum pump, and direct current voltage is applied to the electrostatic electrode 22 of the ceramic plate 20 and electrostatic attraction force is generated, thereby fixing the wafer W by attraction to the wafer placement surface 21 (specifically, to the upper surface of the seal band 21a and the upper surfaces of the small circular protrusions 21b). Also, electricity is applied to the heater electrode 23, thereby heating the ceramic plate 20, and the wafer W is heated to a predetermined temperature. Further, backside gas is introduced into the sleeve through holes 54 making up the gas holes 70 from a gas tank that is omitted from illustration. A heat-transferring gas (e.g., He gas or the like) is used as the backside gas. The backside gas introduced into the gas holes 70 fills and is sealed into a space between a rear surface of the wafer W and the reference surface 21c of the wafer placement surface 21 (space encompassed by the rear surface of wafer W, the seal band 21a and the small circular protrusions 21b of the wafer placement surface 21, and the reference surface 21c). The presence of this backside gas enables transfer of heat between the wafer W and the ceramic plate 20 to be efficiently performed. Next, the inside of the chamber is made to be a reactive gas atmosphere of a predetermined pressure (e.g., several tens to several hundreds of Pa). In this state, RF voltage is applied between an upper electrode, omitted from illustration, which is installed at a ceiling portion within the chamber, and the base plate 30 of the wafer placement table 10, thereby generating plasma. The surface of the wafer W is treated by the plasma that is generated. Refrigerant is circulated through the refrigerant flow path 32 of the base plate 30 when appropriate.

Figure 6A:
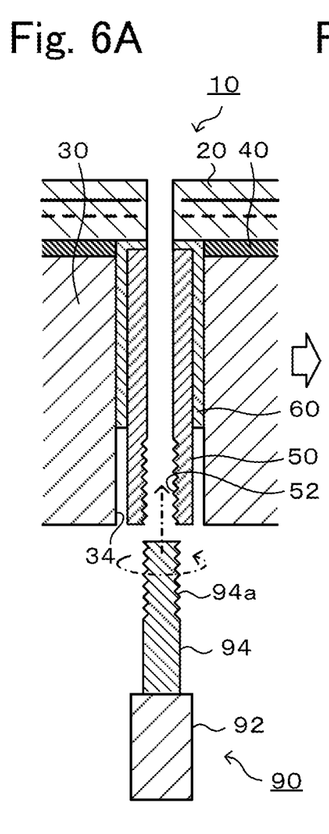
FIGS. 6A to 6C are process diagrams of work for removing an insulating sleeve 50 from a base plate through hole 34.
Figure 6B:
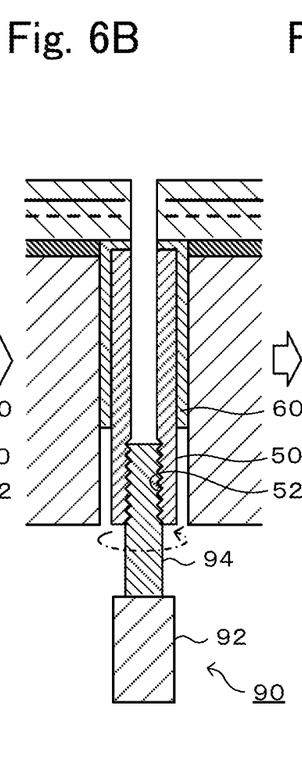
Figure 6C:
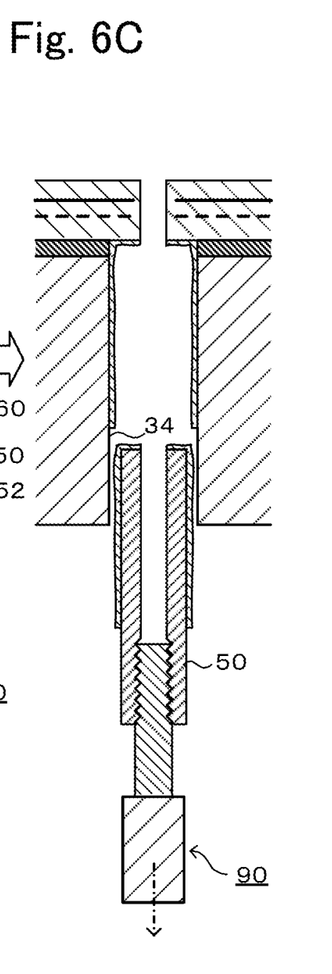

When the wafer placement table 10 is used for long periods of time, the adhesion layers 60 may deteriorate due to corrosion and become worn. At this time, other parts of the wafer placement table 10 are often still usable. In such a case, the adhesion layers 60 are subjected to reworking, and the wafer placement table 10 is brought to a usable state again. FIGS. 6A to 6C are process diagrams of work for removing an insulating sleeve 50 from a base plate through hole 34. First, a reworking tool (external tool) 90 is prepared. The reworking tool 90 is a tool in which a shaft 94 that is slender is attached to a handle 92 that can be gripped by hand, and has a male screw thread portion 94a on a distal end of the shaft 94. A worker grips the handle 92 of the reworking tool 90 and screws the male screw thread portion 94a of the reworking tool 90 into the female screw thread portion 52, which is the tool engaging portion of the insulating sleeve 50 (FIG. 6A). Next, the worker applies force to the handle 92 in the same direction as the direction of screwing in (FIG. 6B). The female screw thread portion 52 thus transmits rotation torque of the reworking tool 90 to the insulating sleeve 50. Accordingly, the insulating sleeve 50 is made to rotate integrally with the reworking tool 90, and hence the adhesion layer 60 is broken by this rotation force. Thereafter, the worker extracts the insulating sleeve 50 that has become one with the reworking tool 90 from the base plate through hole 34 (FIG. 6C). The base plate through hole 34 and the insulating sleeve 50 are then cleaned, following which the insulating sleeve 50 is coated with an adhesive agent and then inserted into the base plate through hole 34, and the adhesive agent is cured. Thus, the wafer placement table 10 is in a usable state again.

In the wafer placement table 10 described in detail above, the insulating sleeve 50 has the female screw thread portion 52 serving as the tool engaging portion that is engageable with the reworking tool 90. Upon being engaged with the reworking tool 90, the female screw thread portion 52 transmits the rotation torque of the reworking tool 90 to the insulating sleeve 50. When the insulating sleeve 50 is removed from the base plate through hole 34, the male screw thread portion 94a of the reworking tool 90 is engaged with the female screw thread portion 52. Rotating the reworking tool 90 breaks the adhesion layer 60 by the rotation torque thereof. Accordingly, the insulating sleeve 50 can be easily removed from the base plate through hole 34.

Also, when the female screw thread portion 52 is provided upward from the bottom surface 32a of the refrigerant flow path 32, the shape of the female screw thread portion 52 may affect the heat uniformity of the wafer W, but the female screw thread portion 52 is provided downward from the bottom surface 32a of the refrigerant flow path 32 here, and accordingly the effects thereof are reduced.

Further, the lower end of the adhesion layer 60 is situated at a height that is the same as or downward from the bottom surface 32a of the refrigerant flow path 32. Thus, heat from the ceramic plate 20 is efficiently transferred to the refrigerant flow path 32 via the adhesion layer 60. Also, the lower end of the adhesion layer 60 is situated upward from the female screw thread portion 52. Accordingly, a smaller amount of the adhesion layer 60 is needed, and the insulating sleeve 50 is easier to be removed from the base plate through hole 34.

Furthermore, the material of the bonding layer 40 is metal, and accordingly deterioration due to corrosion is reduced as compared to resin. Accordingly, the life of the adhesion layer 60 between the insulating sleeve 50 and the base plate through hole 34 tends to be the shortest out of various types of parts making up the wafer placement table 10. Hence, the significance of applying the present invention is great in a case in which the bonding layer 40 is made of metal.

Note that the present invention is in no way limited to the above-described embodiment, and it is needless to say that the present invention can be carried out through various forms, as long as they belong to the technical scope of the present invention.

Although the insulating sleeve 50 including the female screw thread portion 52 as the tool engaging portion is exemplified in the embodiment described above, this is not restrictive in particular. For example, an insulating sleeve 150, 250, 350, 450, or 550 illustrated in FIGS. 7A to 7C to FIGS. 11A to 11C may be employed instead of the insulating sleeve 50. FIG. 7A to FIG. 11A are plan views, FIG. 7B to FIG. 11B are front views, and FIG. 7C to FIG. 11C are bottom views. In FIGS. 7A to 7C to FIGS. 11A to 11C, components that are the same as those in the insulating sleeve 50 in the above-described embodiment are denoted by the same symbols.

Figure 7A:
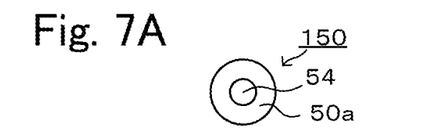
FIGS. 7A to 7C are explanatory diagrams of an insulating sleeve 150.
Figure 7B:
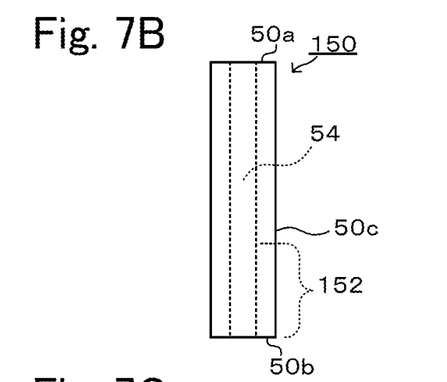
Figure 7C:
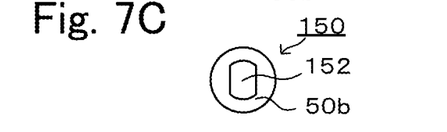

The insulating sleeve 150 illustrated in FIGS. 7A to 7C has a tool engaging portion 152 in the sleeve through hole 54. The tool engaging portion 152 has a double-chamfered shape (a shape in which a circle is cut away along two parallel chords) in a lateral cross-section over a section of the sleeve through hole 54 from the lower end surface 50b of the insulating sleeve 150 to a predetermined height. The lateral cross-section is a cross section taken on a plane that is parallel to the wafer placement surface 21 in FIG. 2. The predetermined height is decided such that an upper end of the tool engaging portion 152 is lower than the bottom surface 32a of the refrigerant flow path 32 when the insulating sleeve 150 is adhered to the base plate through hole 34. In this case, a tool that fits to the tool engaging portion 152 can be used as the reworking tool. Also, when the insulating sleeve 150 is extracted from the base plate through hole 34, another tool can be pressed against an inner surface of the tool engaging portion 152 (or an inner surface of the sleeve through hole 54) to extract the insulating sleeve 150. Note that in FIGS. 7A to 7C, a polygon (e.g., square, pentagon, hexagon, etc.) may be employed instead of the double-chamfered shape in the lateral cross-section.

Figure 8A:
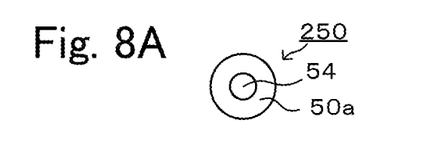
FIGS. 8A to 8C are explanatory diagrams of an insulating sleeve 250.
Figure 8B:
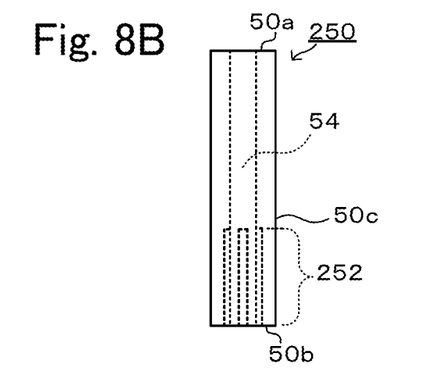
Figure 8C:
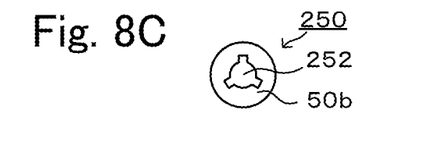

The insulating sleeve 250 illustrated in FIGS. 8A to 8C has a tool engaging portion 252 in the sleeve through hole 54. The tool engaging portion 252 has a shape in which protruding portions are provided to a circle in a lateral cross-section over a section of the sleeve through hole 54 from the lower end surface 50b of the insulating sleeve 250 to a predetermined height. The predetermined height is decided such that an upper end of the tool engaging portion 252 is lower than the bottom surface 32a of the refrigerant flow path 32 when the insulating sleeve 250 is adhered to the base plate through hole 34. In this case, a tool that fits to the tool engaging portion 252 can be used as the reworking tool. Also, when the insulating sleeve 250 is extracted from the base plate through hole 34, another tool can be pressed against an inner surface of the tool engaging portion 252 (or the inner surface of the sleeve through hole 54) to extract the insulating sleeve 250. Note that in FIGS. 8A to 8C, a shape in which recessed portions are provided to a circle may be employed in the lateral cross-section instead of the shape in which protruding portions are provided to a circle.

Figure 9A:
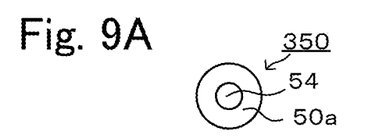
FIGS. 9A to 9C are explanatory diagrams of an insulating sleeve 350.
Figure 9B:
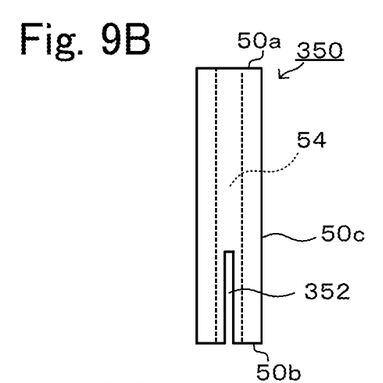
Figure 9C:
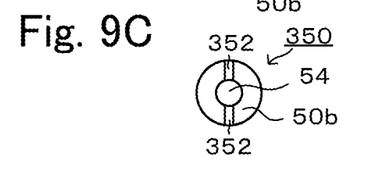

The insulating sleeve 350 illustrated in FIGS. 9A to 9C has two slit grooves 352 along the up-down direction from the lower end surface 50b to a predetermined height. These two slit grooves 352 are equivalent to the tool engaging portion. The predetermined height is decided such that upper ends of the slit grooves 352 are lower than the bottom surface 32a of the refrigerant flow path 32 when the insulating sleeve 350 is adhered to the base plate through hole 34. In this case, a tool that fits to the two slit grooves 352 can be used as the reworking tool. Also, when the insulating sleeve 350 is extracted from the base plate through hole 34, another tool can be pressed against the inner surface of the sleeve through hole 54 to extract the insulating sleeve 350.

Figure 10A:
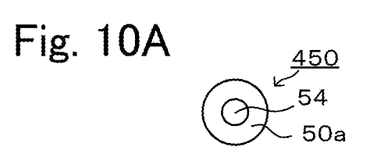
FIGS. 10A to 10C are explanatory diagrams of an insulating sleeve 450.
Figure 10B:
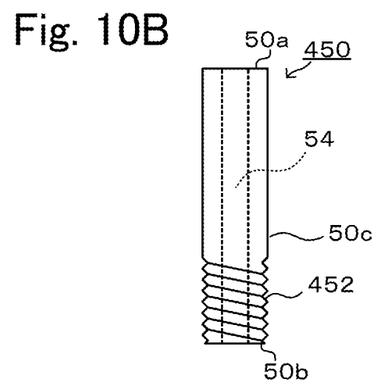
Figure 10C:
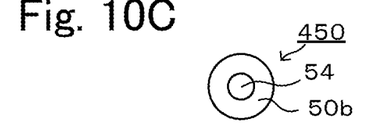

The insulating sleeve 450 illustrated in FIGS. 10A to 10C has a male screw thread portion 452 on an outer peripheral surface of the insulating sleeve 450 over a section from the lower end surface 50b to a predetermined height. This male screw thread portion 452 is equivalent to the tool engaging portion. The predetermined height is decided such that an upper end of the male screw thread portion 452 is lower than the bottom surface 32a of the refrigerant flow path 32 when the insulating sleeve 450 is adhered to the base plate through hole 34. In this case, a tool having a female screw thread portion that is screwable to the male screw thread portion 452 can be used as the reworking tool. Also, when the insulating sleeve 450 is extracted from the base plate through hole 34, the tool screwed to the male screw thread portion 452 can be pulled out straightforward.

Figure 11A:
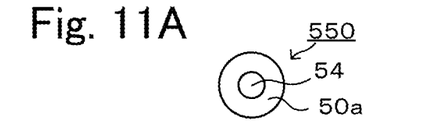
FIGS. 11A to 11C are explanatory diagrams of an insulating sleeve 550.
Figure 11B:
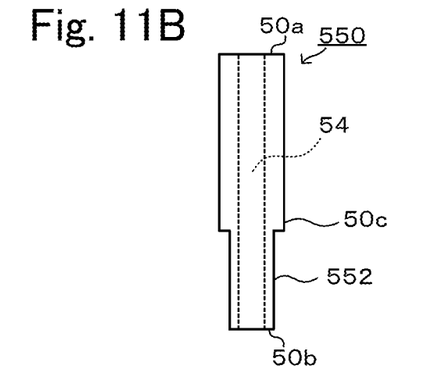
Figure 11C:
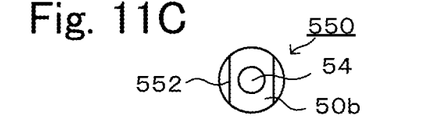

The insulating sleeve 550 illustrated in FIGS. 11A to 11C has a tool engaging portion 552 on an outer peripheral surface thereof. The tool engaging portion 552 is a portion that has a double-chamfered shape in a lateral cross-section over a section of the outer peripheral surface of the insulating sleeve 550 from the lower end surface 50b to a predetermined height. The predetermined height is decided such that an upper end of the tool engaging portion 552 is lower than the bottom surface 32a of the refrigerant flow path 32 when the insulating sleeve 550 is adhered to the base plate through hole 34. In this case, a tool that nips the tool engaging portion 552 (e.g., needle-nose pliers or tweezers) can be used as the reworking tool. Also, when the insulating sleeve 550 is extracted from the base plate through hole 34, the tool nipping the tool engaging portion 552 can be pulled out straightforward. Note that in FIGS. 11A to 11C, a polygon (e.g., square, pentagon, hexagon, etc.) may be employed instead of the double-chamfered shape in the lateral cross-section.

Figure 12A:
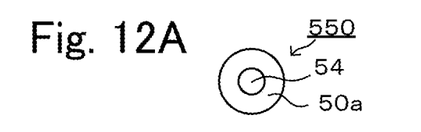
FIGS. 12A to 12C are explanatory diagrams of another example of the insulating sleeve 550.
Figure 12B:
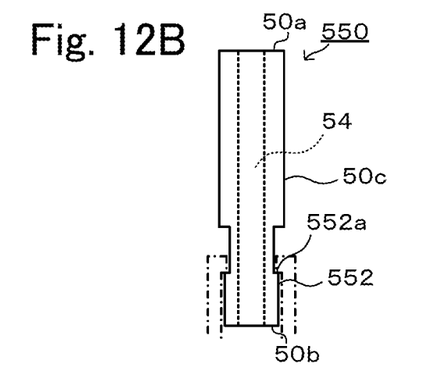
Figure 12C:
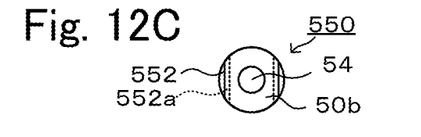

FIGS. 12A to 12C are modifications of the insulating sleeve 550 in FIGS. 11A to 11C. FIG. 12A is a plan view, FIG. 12B is a front view, and FIG. 12C is a bottom view. In the insulating sleeve 550 according to FIGS. 12A to 12C, a stepped surface 552a that faces upward is provided on a planar portion of the tool engaging portion 552 having the double-chamfered shape. Accordingly, when the insulating sleeve 550 is extracted from the base plate through hole 34, a tool with a hook-like tip (e.g., needle-nose pliers or tweezers, see single-dot chain line in FIGS. 12A to 12C) can be used to catch the hook-like tip on the stepped surface 552a and easily perform extraction thereof.

Note that in a case in which the tool engaging portion is provided on the outer peripheral surface of the insulating sleeve, there is a need to insert the reworking tool to the outer peripheral surface of the insulating sleeve, and accordingly the lower end of the adhesion layer preferably is situated upward from the tool engaging portion. Also, in a case in which the tool engaging portion is not a screw thread structure, a stepped surface that faces upward may be provided to the tool engaging portion (e.g., see FIGS. 12A to 12C). Accordingly, catching the external tool on the stepped surface that faces upward enables the insulating sleeve to be extracted from the base plate through hole more easily.

Although the bonding layer 40 made of metal has been exemplified in the above-described embodiment, this is not restrictive in particular. For example, the bonding layer 40 may be made of resin. Examples of resin include insulating resins such as epoxy resin, acrylic resin, silicone resin, and so forth. In a case in which the bonding layer 40 is made of resin, deterioration due to corrosion advances readily, and accordingly, preferably, a space having a ring-like shape is formed between the lower surface of the ceramic plate 20 and the upper surface of the base plate 30 and is formed outside an outer peripheral surface of the bonding layer 40, and a sacrificial ring is disposed in this space. Accordingly, the bonding layer 40 made of resin is protected by the sacrificial ring. Also, in a case in which the sacrificial ring deteriorates due to corrosion, the sacrificial ring can be replaced.

Although the electrostatic electrode 22 and the heater electrode 23 are embedded in the ceramic plate 20 in the above-described embodiment, this is not restrictive in particular. For example, just one of the electrostatic electrode 22 and the heater electrode 23 may be embedded in the ceramic plate 20. Alternatively, the heater electrode 23 may be embedded in two or more stages in the thickness direction.

Although the ceramic plate through holes 24 and the sleeve through holes 54 are used as the gas holes 70 in the above-described embodiment, this is not restrictive in particular. For example, the ceramic plate through holes 24 and the sleeve through holes 54 may be used as lifting pin holes. The lifting pin holes are holes through which lifting pins, for raising and lowering the wafer W with respect to the wafer placement surface 21, are passed. In a case of supporting the wafer W by three lifting pins, for example, three lifting pin holes are provided.

International Application No. PCT/JP2022/028748, filed on Jul. 26, 2022, is incorporated herein by reference in its entirety.

What is claimed is:

1. A member for a semiconductor manufacturing apparatus, comprising:
   a ceramic plate that has a wafer placement surface on an upper surface and that has an electrode embedded therein;
   a ceramic plate through hole that passes through the ceramic plate in an up-down direction;
   a base plate that has electroconductivity and that is disposed on a lower surface side of the ceramic plate;
   a base plate through hole that passes through the base plate in the up-down direction;
   an insulating sleeve which is inserted into the base plate through hole and of which an outer peripheral surface is adhered to an inner peripheral surface of the base plate through hole via an adhesion layer; and
   a sleeve through hole that passes through the insulating sleeve in the up-down direction and that communicates with the ceramic plate through hole,
   wherein the insulating sleeve has a tool engaging portion that is engageable with an external tool, and
   upon being engaged with the external tool, the tool engaging portion transmits rotation torque of the external tool to the insulating sleeve.

2. The member for a semiconductor manufacturing apparatus according to claim 1,
   wherein the base plate has a refrigerant flow path embedded therein, and
   the tool engaging portion is provided downward from a bottom surface of the refrigerant flow path.

3. The member for a semiconductor manufacturing apparatus according to claim 2,
   wherein a lower end of the adhesion layer is situated at a height that is same as or downward from the bottom surface of the refrigerant flow path and that is upward from the tool engaging portion.

4. The member for a semiconductor manufacturing apparatus according to claim 1,
   wherein the tool engaging portion is a female screw thread portion provided in the sleeve through hole, a male screw thread portion provided on the outer peripheral surface of the insulating sleeve, or a plurality of slit grooves provided along the up-down direction from a lower end of the insulating sleeve.

5. The member for a semiconductor manufacturing apparatus according to claim 1,
   wherein a cross section of the sleeve through hole, taken in the tool engaging portion along a plane that is parallel to the wafer placement surface, is a polygon, a shape of a circle provided with a protruding portion or a recessed portion, or a shape in which a circle is cut away along two parallel chords.

6. The member for a semiconductor manufacturing apparatus according to claim 1,
   wherein an outer shape of a cross section of the insulating sleeve, taken in the tool engaging portion along a plane that is parallel to the wafer placement surface, is a polygon, a shape of a circle provided with a protruding portion or a recessed portion, or a shape in which a circle is cut away along two parallel chords.

* * * * *